United States Patent [19]

Maydan et al.

[11] Patent Number: 4,962,063
[45] Date of Patent: Oct. 9, 1990

[54] MULTISTEP PLANARIZED CHEMICAL VAPOR DEPOSITION PROCESS WITH THE USE OF LOW MELTING INORGANIC MATERIAL FOR FLOWING WHILE DEPOSITING

[75] Inventors: Dan Maydan, Los Altos Hills; David N. Wang, Saratoga, both of Calif.

[73] Assignee: Applied Materials, Inc., Santa Clara, Calif.

[21] Appl. No.: 321,943

[22] Filed: Mar. 10, 1989

Related U.S. Application Data

[63] Continuation-in-part of Ser. No. 269,508, Nov. 10, 1988.

[51] Int. Cl.⁵ ........................................... H01L 21/461
[52] U.S. Cl. .................... 437/228; 437/235; 437/236; 437/240; 437/247; 437/982; 148/DIG. 133
[58] Field of Search ............... 437/228, 982, 240, 236, 437/235, 247; 156/643; 148/DIG. 133

[56] References Cited

U.S. PATENT DOCUMENTS

| | | | |
|---|---|---|---|
| 4,401,054 | 8/1983 | Matsuo et al. | 118/723 |
| 4,492,620 | 1/1985 | Matsuo et al. | 204/192 R |
| 4,599,135 | 7/1986 | Tsunekawa et al. | 204/192.32 |
| 4,778,561 | 10/1988 | Ghanbari | 156/643 |
| 4,785,962 | 11/1988 | Toshima | 220/260 |
| 4,808,554 | 2/1989 | Yamazaki | 437/105 |

FOREIGN PATENT DOCUMENTS

| | | | |
|---|---|---|---|
| 0049400 | 4/1982 | European Pat. Off. | 437/228 |
| 51-71068 | 12/1974 | Japan . | |
| 52-021786 | 2/1977 | Japan . | |
| 0076548 | 6/1981 | Japan | 437/982 |
| 61-115329 | 6/1986 | Japan . | |

OTHER PUBLICATIONS

Fu, "A Novel Borophosphosilicate Glass Process", IEEE, New York, U.S.A., 772 pp, pp. 602–605, 1985.
Ditrick and Bae, "An Improved Boron Nitride Glass Transfer Process", Solid State Technology, vol. 23, No. 7, Jul. 1980, pp. 69–73.
Kern and Schnable, "Chemical Vapor-Deposited Borophosphosilicate Glass for Silicon Device Applications", RCA Review, vol. 43, Sep. 1982, pp. 423–457.
Ramiller et al., "Borophosphosilicate Glass for Low Temperature Reflow", Applied Materials, Inc., Technical Report No. GEN-008, pp. 29–37.
Machida, Katsuyuki, et al., "SiO₂ Planarization Technology with Biasing and Electron Cyclotron Resonance Plasma Deposition for Submicron Interconnections", *J. Vac. Sci. Technol. V,* vol. 4, No. 4, Jul./Aug. 1986, pp. 818–821.

Primary Examiner—Olik Chaudhuri
Assistant Examiner—Tuan Nguyen
Attorney, Agent, or Firm—Paul L. Hickman; John P. Taylor

[57] ABSTRACT

An improved planarization process is disclosed which comprises depositing over a patterned integrated circuit structure on a semiconductor wafer a conformal insulation layer by ECR plasma deposition of an insulation material. The ECR plasma deposition is carried out until the trenches or low regions between adjacent raised portions of the structure are completely filled with insulation material. A planarization layer of a low melting glass material, such as a boron oxide glass, is then flowed as it is deposited over the integrated circuit structure to a depth or thickness sufficient to cover the highest portions of the ECR plasma deposited insulation layer. This planarization layer is then anistropically etched back sufficiently to provide a planarized surface on the ECR plasma deposited insulation layer. A further layer of insulation material may then be conventionally CVD deposited over the planarized ECR plasma deposited insulation layer which acts to encapsulate any remaining portions of the planarizing layer.

21 Claims, 3 Drawing Sheets

MULTISTEP PLANARIZED CHEMICAL VAPOR DEPOSITION PROCESS WITH THE USE OF LOW MELTING INORGANIC MATERIAL FOR FLOWING WHILE DEPOSITING

CROSS REFERENCE TO RELATED APPLICATIONS

This application is a continuation-in-part of Marks et al U.S. patent application Ser. No. 269,508, filed Nov. 10, 1988.

BACKGROUND OF THE INVENTION

1. Field of the Invention

This invention relates to a planarization process for integrated circuit structures. More particularly, this invention relates to a planarization process which utilizes an initial ECR plasma deposition to achieve a high density vertical deposition of a conformal insulation layer with a high aspect ratio; a low melting inorganic planarization material to planarize the ECR plasma deposited layer; and an optional CVD layer applied over the planarized ECR plasma layer.

2. Description of the Related Art

In the formation of integrated circuit structures, patterning of layers, to permit formation, on a substrate, of active devices such as transistors, passive devices such as resistors, and metal lines to interconnect devices, can result in the formation of uneven surfaces.

Conventionally, a layer of insulating material such as silicon oxide is applied over such uneven surfaces, to permit the formation of further patterned layers thereover. However, the silicon oxide tends to conform to the underlying topography resulting in the creation of a nonplanar or stepped surface. It is very difficult to pattern further layers over such an uneven surface using standard lithography techniques.

It has, therefore, become the customary practice to apply planarizing layers of either photoresist or organic-based glass materials, such as "SOG" (Spin On Glass) which will etch at about the same rate as the underlying silicon oxide insulating layer. The structure is then anisotropically etched to remove the planarizing layer, as well as raised portions of the underlying silicon oxide layer.

However, both photoresist and SOG have what is called a loading effect. This means that the etch rate of these materials depends upon how much of the insulating layer, e.g., the silicon oxide layer, is exposed. Thus, achieving an equal etch rate of both insulating material (silicon oxide) and the sacrificial or planarizing material is very difficult and the etch rate is, therefore, dependent upon the geometry of the structure. Furthermore, when the spaces between raised portions are less than about 1.5 microns, the spinning process of applying either of these two planarizing materials is not effective.

The above described planarizing materials also have limited step coverage and are limited with respect to the total amount or thickness of these materials which can be deposited. Furthermore, since these planarizing materials are dispersed in organic binders and solvents, prior to application of such planarizing materials, the integrated circuit structure must be removed from a vacuum chamber in which the insulating layer such as silicon oxide is deposited, e.g., by CVD methods, in order to coat the structure with the planarizing layer. After such coating, the solvent in the planarizing coating must be allowed to evaporate and the planarizing coating must then be baked to remove further solvents and to harden the coating prior to the etching step, which is conventionally a dry etching process which is also usually carried out in a vacuum chamber.

These problems were addressed in parent U.S. Pat. application, Marks et al Ser. No. 269,508, filed Nov. 10, 1988, entitled METHOD FOR PLANARIZING AN INTEGRATED CIRCUIT STRUCTURE USING LOW MELTING INORGANIC MATERIAL, cross-reference to which is hereby made. In that application, there is described and claimed a method for planarizing such structures using a planarizing layer of a low melting inorganic glass which is deposited over a conformal insulating layer such as a silicon oxide formal insulating layer such as a silicon oxide layer.

However, the initial conformal insulating layer, e.g. a layer of silicon oxide, which is conventionally applied over the underlying metal lines or other patterned layers using CVD deposition techniques, does not always adequately fill in those regions between closely spaced apart metal lines or other raised parts of the underlying integrated circuit structure. This can result in the formation of voids in those portions of the silicon oxide layer deposited between such closely spaced apart raised parts of the integrated circuit structure.

A form of deposition known as electron cyclotron resonance (ECR) plasma deposition, is described in Matsuo et al U.S. Pat. No. 4,401,054; Matsuo et al U.S. Pat. No. 4,492,620; and Ghanbari U.S. Pat. No. 4,778,561 (cross-reference to which three patents is hereby made); as well as in an article by Machida et al, entitled "$SiO_2$ Planarization Technology With Biasing and Electron Cyclotron Resonance Plasma Deposition for Submicron Interconnections", published in *J. Vac. Sci. Technology B*, Vol. 4, No. 4, Jul/Aug 1986, at pp. 818–821.

The ECR plasma deposition process described in these publications provides deposition of material via a plasma wherein a plasma formation chamber is surrounded by one or more magnetic coils to generate a magnetic field which produces an electron cyclotron resonance in the plasma formation chamber with the axis of the magnetic field extending toward a deposition chamber in a divergent manner. The resulting deposition, for example, of $SiO_2$ from oxygen and silane gases, is a more dense conformal insulating layer with a high aspect ratio to provide better filling of the regions between closely spaced apart lines, thus eliminating or at least mitigating the problem of void formation in the insulation material deposited in such areas.

However, while such an ECR plasma deposited conformal insulating layer does solve the void formation problem discussed above, the ECR plasma process is considerably slower than a conventional CVD deposit. Furthermore, the planarization problems associated with silicon oxide layers, as discussed in the aforementioned Marks et al parent patent application, also apply to the formation of a silicon oxide layer using ECR plasma deposition techniques as well.

It would, therefore, be desirable to provide a planarization process wherein the problem of void formation could be eliminated while expediting the planarization process and without the need for removing the integrated circuit structure from the vacuum apparatus used to deposit one or more of the planarization layers.

SUMMARY OF THE INVENTION

It is, therefore, an object of this invention to provide a process for planarizing an integrated circuit structure comprising an initial ECR plasma deposition of a conformal insulation layer followed by application thereto of a low melting inorganic planarizing material.

It is another object of this invention to provide a process for planarizing an integrated circuit structure which comprises the steps of ECR plasma depositing a conformal insulating layer over an integrated circuit substrate followed by depositing a layer of a low melting inorganic planarizing material thereon, and then planarizing the structure by etching the inorganic planarizing layer.

It is another object of this invention to provide a process for planarizing an integrated circuit structure which comprises the steps of ECR plasma depositing a conformal insulating layer over an integrated circuit substrate followed by depositing a layer of a low melting glass planarizing material thereon, and then planarizing the structure by dry etching the low melting glass planarizing layer.

It is yet another object of this invention to provide a process for planarizing an integrated circuit structure which comprises the steps of ECR plasma depositing a conformal insulating layer over an integrated circuit substrate followed by depositing a layer of a low melting glass planarizing material thereon, and then anisotropically dry etching the low melting glass planarizing layer in an etching zone in the apparatus without exposing the coated structure to the ambient atmosphere.

It is still another object of this invention to provide a process for planarizing an integrated circuit structure which comprises the steps of ECR plasma depositing a conformal insulating layer over an integrated circuit substrate followed by depositing a layer of a low melting glass planarizing material thereon, etching the low melting glass planarizing layer to remove at least some of the low melting inorganic planarizing material, and then depositing a further layer of an insulating material over the structure.

It is a further object of this invention to provide a process for planarizing an integrated circuit structure which comprises the steps of ECR plasma depositing a conformal insulating layer over an integrated circuit substrate, depositing a layer of a low melting glass planarizing material thereon, etching the low melting glass planarizing layer to planarize the structure, and then CVD depositing a further layer of an insulating material over the structure.

It is yet another object of this invention to provide apparatus for planarizing an integrated circuit structure which comprises means for ECR plasma depositing a conformal insulating layer over an integrated circuit substrate, means for depositing a layer of a low melting glass planarizing material thereon, means for anisotropically dry etching the low melting glass planarizing layer to planarize the structure, and means for then CVD depositing a further layer of an insulating material over the structure.

These and other objects of the invention will be come apparent from the following description and accompanying drawings.

DETAILED DESCRIPTION OF THE INVENTION

In accordance with the invention, an improved planarization process is provided wherein over a patterned integrated circuit structure of a semiconductor wafer is first formed a conformal insulation layer deposited by ECR plasma deposition of an insulation material. The ECR plasma deposition is carried out until the trenches or low regions between adjacent high regions are completely filled with insulation material. A planarization layer of a low melting glass material, such as a boron oxide glass, is then formed over the integrated circuit structure to a depth or thickness sufficient to cover the highest portions of the ECR plasma deposited insulation layer.

This planarization layer is then anisotropically dry etched back to remove some or all of the planarization material, resulting in a planarized surface on the ECR plasma deposited insulation layer. An optional further layer of insulation material may then be conventionally CVD deposited over the planarized ECR plasma deposited insulation layer.

The process may be used for front end application such as dielectric planarization, for filling trenches or slots, or for top side planarization as well as the illustrated intermetal planarization. For example, when using the process in a front end application, a phosphorus silicate glass (PSG) may be used as the insulating material to be planarized. The process may also be used to planarize an integrated circuit structure prior to a blanket deposit of another metal layer such as tungsten.

By use of the term "raised portions" is meant portions of an integrated circuit structure raised with respect to the height of the surface therebetween and thus may include not only structures raised with respect to the entire surface but also the raised sidewalls, for example, of a trench or slot with respect to the bottom of the trench.

Figure 2:
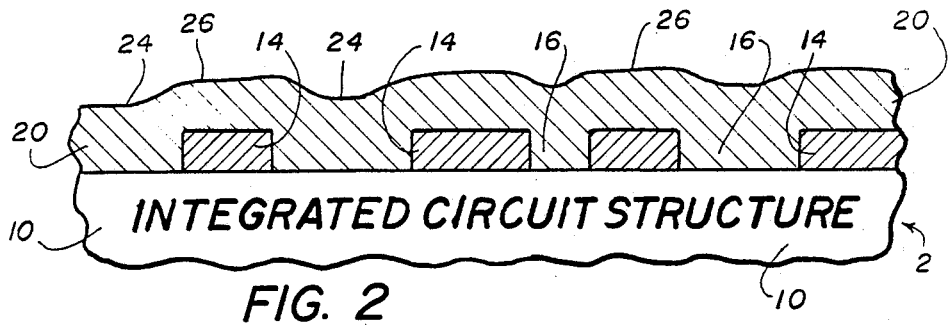
FIG. 2 is a fragmentary vertical cross-sectional view of an integrated circuit structure having patterned layers thereon and a conformal insulating layer formed thereover by ECR plasma deposition.

Turning now to FIG. 2, an integrated circuit structure is generally shown at 2 comprising a semiconductor wafer or substrate 10, such as, for example, a silicon substrate, having raised portions 14 thereon which may comprise, for example, metal lines or other conductive or insulating materials.

A conformal insulation layer 20, which may, for example, comprise a silicon oxide, a silicon oxynitride, or a silicon nitride layer, or a silicate such as phosphorus silicate when the underlying integrated circuit structure comprises silicon, is shown formed over substrate 10 and raised portions 14 thereon. Insulation layer 20 may comprise either a doped or undoped material. Other insulation materials may, of course, be used as well and may even be preferred over those just named when the underlying structure comprises some other material than silicon, e.g., germanium, gallium arsenide, etc.

In accordance with the invention, conformal insulation layer 20 is deposited thereon using a ECR plasma deposition apparatus such as disclosed in the aforementioned Matsuo et al U.S. Pat. No. 4,401,054; Matsuo et al U.S. Pat. No. 4,492,620; and Ghanbari U.S. Pat. No. 4,778,561.

As seen in FIG. 2, the ECR plasma deposition is carried out until the height of the insulation material in the low regions 16 between the raised portions 14 is slighter higher than the height of raised portions 14, as shown at 24. The ECR plasma deposition may be used, for example, to form a silicon oxide layer thereon, using the apparatus shown in the aforementioned Matsuo et al and Ghanbari patents. As described in these patents, and in the Machida et al article, an rf bias may be optionally applied to substrate 10 to facilitate the ECR plasma deposition.

To carry out the ECR plasma deposition step of the invention, for example, to form a $SiO_2$ insulation layer, oxygen should be fed into the plasma formation chamber at a rate of from about 15 standard cubic centimeters per minute (sccm) to about 300 sccm and silane into the deposition chamber, at a rate of from about 15 sccm to about 300 sccm while maintaining the temperature in the deposition chamber at from about 25° C. to about 400° C. and a pressure ranging from about 0.05 to about 20 millitorr.

The magnetic flux density of the magnet used to provide the electron cyclotron resonance in the plasma formation chamber should range from about 500 to about 2500 gauss while the microwave frequency used to form the plasma should range from about 1 to about 4 gHz. A plasma power level of from about 100 to about 1500 watts should be used. For example, when the magnetic flux density is 875 gauss, the microwave frequency should be 2.45 gHz.

The ECR plasma deposition parameters are preferably adjusted to provide an aspect ratio (depth to width) of at least 1 and preferably as high as 3.

After depositing the ECR plasma insulating layer to the desired depth or thickness, the low melting glass planarizing layer may be deposited over the conformal insulation layer. This second deposition may be carried out in the same vacuum chamber or, preferably, the integrated circuit structure, e.g., silicon wafer 10, may be transferred to a second vacuum chamber, preferably without exposing the structure to the ambient atmosphere, using a second deposition chamber in the same vacuum apparatus as will be explained below.

In accordance with the invention, a planarizing layer 30 of a low melting inorganic material, such as a low melting glass, is then applied over insulating layer 20, and then the coated structure is subjected to a planarizing etch step to remove some or all of planarizing layer 30 as well as the higher regions 26 of underlying insulating layer 20.

Low melting inorganic planarizing material 30 may comprise any inorganic material which: (a) may be deposited on the surface of insulating layer 20 without the use of a solvent; (b) which does not need to be subsequently cured or baked to harden the deposited material sufficiently to permit etching thereof; and (c) is capable of being anisotropically etched, preferably anisotropically dry etched, at approximately the same rate as the underlying insulation layer.

In a preferred embodiment, low melting inorganic planarizing material 30 comprises a material which may be deposited over insulating layer 20 using any conventional chemical vapor deposition apparatus. By "low melting" is meant a material which has a melting point of about 575° C. or lower, and which will flow at about 500° C. or lower, i.e., from about 100° to about 500° C. In a preferred embodiment where the process will be used over low melting materials already present in the integrated circuit structure such as aluminum, e.g., over aluminum lines or in topside applications, the melting point should not exceed about 480° C. with a flow of 390° C. or lower. The use of a material which will flow at about 390° C. or lower will result in the flowing of the material over the underlying surface without risk of any harm to the underlying integrated circuit structure.

By way of example, the low melting inorganic planarizing material comprises a low melting glass. Examples of such low melting glasses include $B_2O_3$, $B_2S_6$, $B_2O_3$/$SiO_2$ mixtures, $As_2O_3$, $As_2S_3$, $P_2O_5$, or any combinations of the above.

Figure 3:
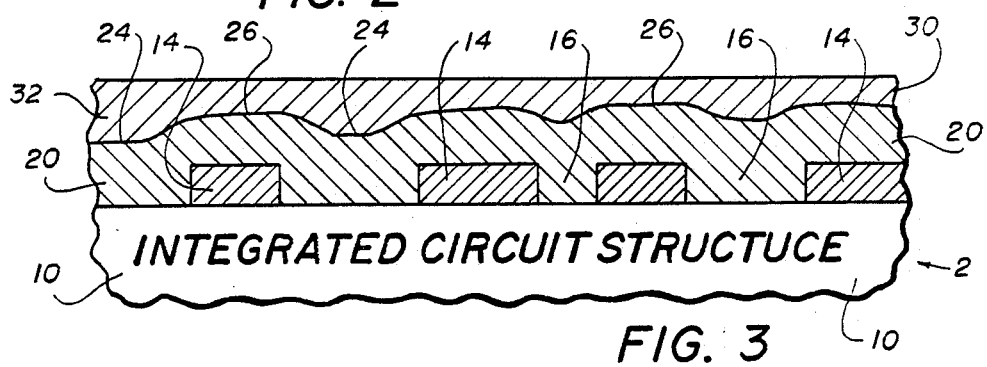
FIG. 3 is a fragmentary vertical cross-sectional view of the integrated circuit structure of FIG. 2 showing a planarizing layer of a low melting glass material deposited over the conformal insulating layer.

By using a low melting planarizing material such as a low melting glass, planarizing material 30 may be deposited using, for example, the same CVD methods and apparatus used to deposit the insulating material 20 such as silicon oxide. Thus, a deposition of a low melting glass such as, for example, $B_2O_3$ at from about 390° C. to about 480° C., at which temperature the planarizing material will flow over the stepped surface of insulating layer 20 on integrated circuit structure 10, will result in the generally planar surface 32 on layer 30 as shown in FIG. 3.

A lower deposition temperature may, of course, be used if the material is subsequently heated sufficiently to cause the planarizing material to flow over the surface. However, usually such an additional heating step will be avoided if possible. A lower deposition temperature may also be used provided that the low melting planarizing material has a flow point temperature at least as low as the deposition temperature so that the planarization material will flow as it is deposited.

It should be noted that both depositions may be carried out in the same deposition chamber or in separate chambers within the same apparatus which may be interconnected in a manner which permits transfer of the integrated circuit structure from one chamber to another without exposure to the atmosphere and particularly to moisture and other contaminants in the atmosphere as will be described.

The use of the same deposition chamber or at least the same general vacuum apparatus for deposition of both layers 20 and 30, together with the selection of a low melting inorganic material as the planarizing material which does not use solvents which must be removed, and which does not require further baking or curing prior to etching, permits the preferential carrying out of the two deposition steps sequentially in the same apparatus without intermediate removal of the integrated circuit structure from the vacuum apparatus. This not only reduces the total number of process steps, compared to the prior art planarizing processes, but additionally protects the integrated circuit structure from the risk of possible contamination which may occur whenever the semiconductor wafer containing the integrated circuit structure is removed from the vacuum apparatus and exposed to the atmosphere.

The low melting inorganic material is deposited onto the surface of insulating layer 20 within a temperature range from about 100° C. to about 700° C., preferably 300° C. to about 500° C., and under a pressure of from about pb 1 millitorr to about atmospheric pressure, preferably from about 2 to 30 torr, to a thickness of from about 200 Angstroms, at its thinnest, up to about 2 microns in its thickest regions, i.e., overlying the low areas of the insulation layer beneath it. In a typical plasma CVD deposition of $B_2O_3$, the deposition temperature ranges from about 390° C. to about 440° C. at a pressure of about 9-10 torr with an rf plasma power of about 400-500 watts.

Figure 4:
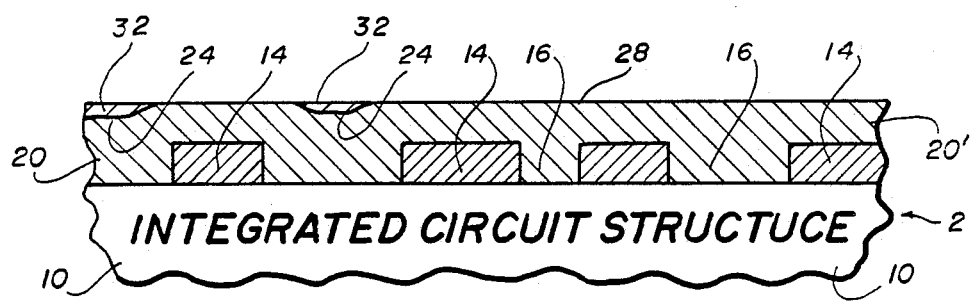
FIG. 4 is a fragmentary vertical cross-sectional view of the integrated circuit structure of FIG. 3 after planarization of the structure.

After deposition of the lo ting inorganic planarizing material, the coated structure is then anisotropically dry etched until the high areas 26 of insulating layer 20 have been removed as well as at least a portion of planar layer 30, as shown at the top surface indicated by solid line 28 of FIG. 4. This leaves a portion 20' of insulating layer 20 slkightly higher than the height of the lowest portions 24 of layer 20 with segments 32 of planarizing 30 optionally left over the low points 24 of layer 20.

It should be noted, in this regard, that while surface line 28 is shown as substantially flat, the planarized surface may still have somewhat raised portions adjacent the underlying raised parts of the integrated circuit structure, e.g., above patterned portions 14. However the 45° or higher slopes of the steps of the unplanarized insulation layer will be reduced down to about 10° to 15° or even lower after the planarization process of this invention.

It should also be noted that the final slope is controllable by varying the film thickness and/or deposition temperature used to deposit the planarizing material. Raising the deposition temperature reduces the slope because the planarizing material will flow better. Increasing the thickness of the planarizing material will also cause the film to flow more evenly across the underlying integrated circuit structure.

The etch step may comprise any etch system capable of etching both the planarizing layer 30 and underlying insulating layer 20 at approximately the same rate. The etchant may comprise any dry etch such as a conventional anisotropic dry etch. Preferably the dry etch will comprise a plasma etch using $CHF_3$ or $CF_4$ or argon. Examples of other dry etching systems useful in the practice of the invention include a sputter etching system or an RIE system.

Figure 1:
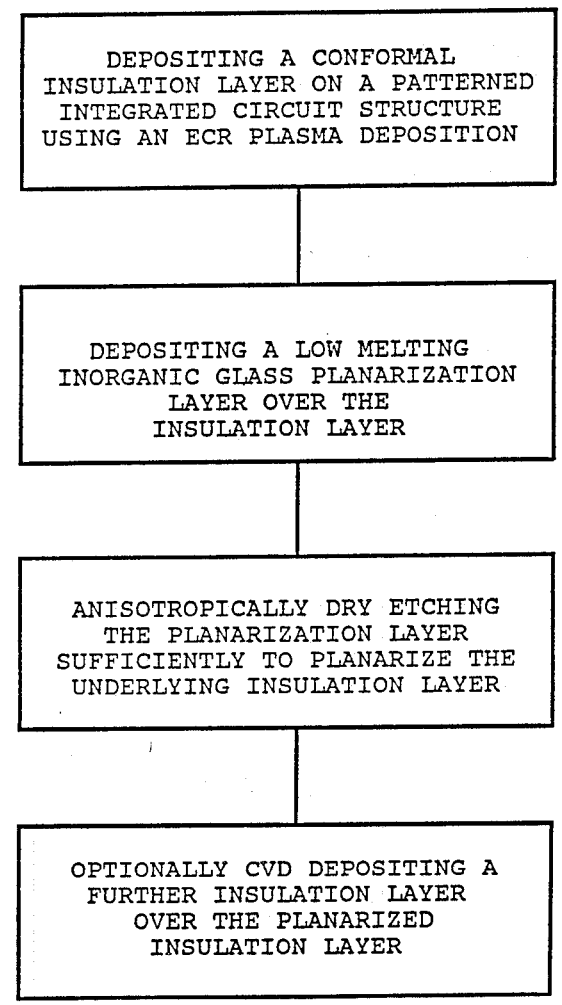
FIG. 1 is a flow sheet illustrating the process of the invention.

In a particularly preferred embodiment of the invention, the integrated circuit structure, after having both the insulation layer and the planarizing layer deposited in the same vacuum apparatus, may be etched in the same chamber or in another zone or chamber in the same apparatus while still maintaining the integrated circuit structure under vacuum. Thus, as shown in the flow chart of FIG. 1, the integrated circuit structure may be coated with both insulation layer 20 and planarizing layer 30 in a deposition zone, which may comprise the same or different deposition chambers in a common deposition apparatus, and then the coated structure may be either anisotropically dry etched in the same chamber or moved to or through an interlock or intermediate chamber from which the coated structure may be moved to an etching zone without removing the coated structure from the vacuum apparatus.

Figure 5:
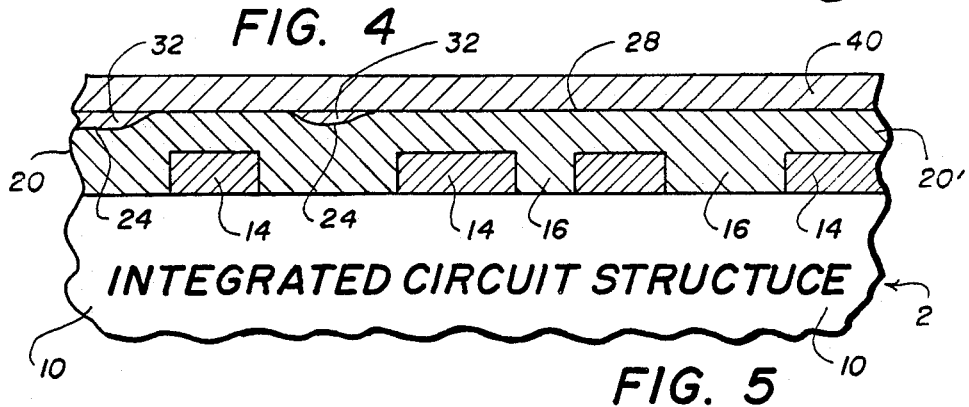
FIG. 5 is a fragmentary vertical cross-sectional view of the integrated circuit structure of FIG. 4 with a further layer of insulation material CVD deposited over the planarized structure.

Referring now to FIG. 5, the planarized integrated circuit structure may now be optionally subjected to a conventional CVD deposition in the same chamber, or in another chamber in the same vacuum apparatus, to form a further layer 40 of an insulation material thereon such as any of the previously mentioned insulation materials used to form conformal insulation layer 20.

While layer 40 could also be formed using an ECR plasma deposition, as used in forming layer 20, it is preferable that a conventional CVD deposition be used at this point since a conventional CVD deposition will deposit material at a faster rate than a ECR plasma deposition and the high aspect ratio and dense deposition characteristic of the ECR plasma deposition is not needed at this step of the process since void formation is not a major problem after satisfactory planarization is completed.

As discussed earlier with regard to the previous deposition and etching steps, this CVD deposition is also advantageously carried out in the same deposition chamber, or at least in the same vacuum apparatus, to avoid exposure to the atmosphere and particularly to moisture and other contaminants in the atmosphere.

It should also be noted that while this formation of insulation layer 40 over the planarized structure is referred to an an optional step, if during the planarization step all of planarization layer 30 is not removed, leaving portions 32 in the low spots in the integrated circuit structure, as shown in FIG. 4, the use of a subsequent insulation layer 40 is then necessary to encapsulate any remaining portions of planarizing layer 30 due to the hygroscopic nature of the low melting glasses which may be used to form planarizing layer 30.

Figure 6:
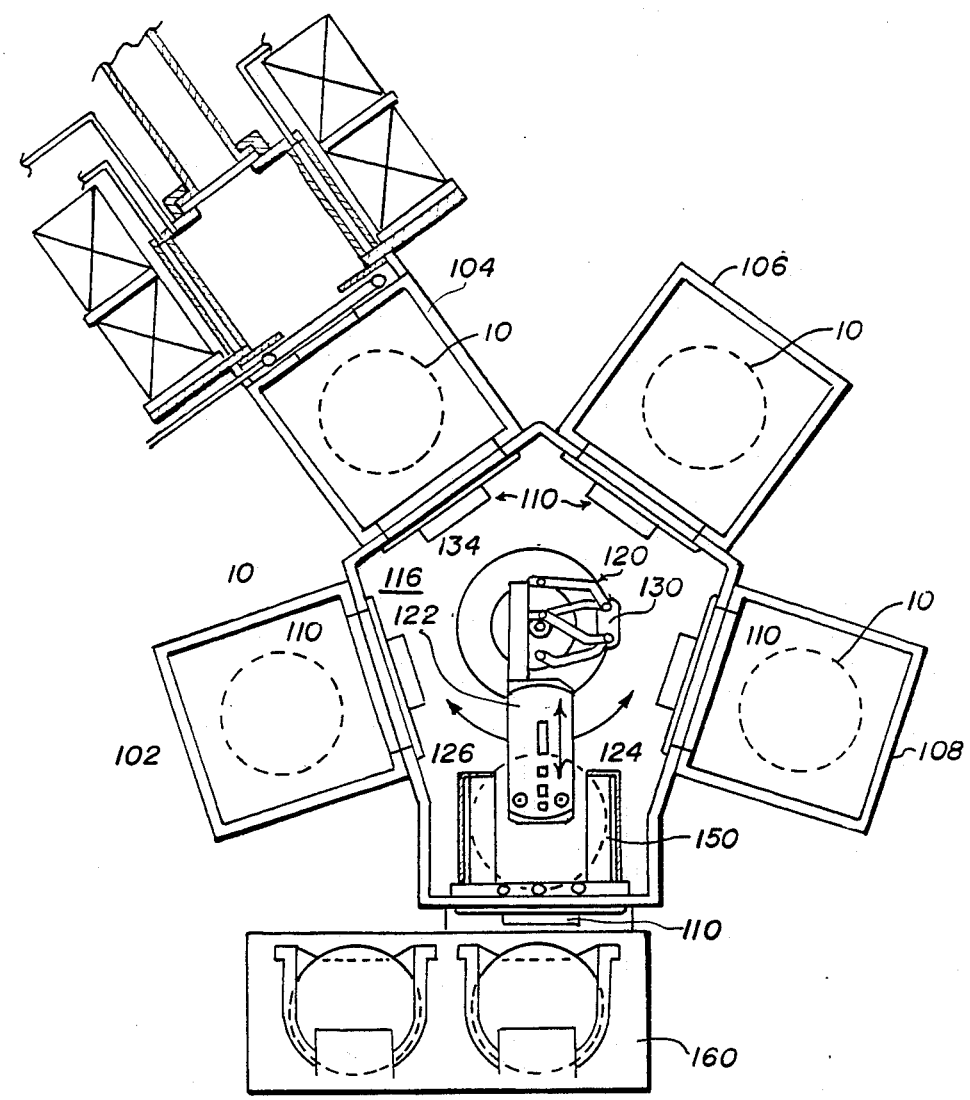
FIG. 6 is a schematic view of apparatus which may be used in carrying out the process of the invention.

Referring now to FIG. 6, a vacuum apparatus useful in the practice of the invention is generally depicted at 100 comprising a number of deposition and etching chambers 102-108, at least one of which is capable of ECR plasma deposition. Details of construction of such an ECR chamber are described in Matsuo et al U.S. Pat. No. 4,401,054; Matsuo et al U.S. Pat. No. 4,492,620; and Ghanbari U.S. Pat. No. 4,778,561; as well as in an article by Machida et al, entitled "$SiO_2$ Planarization Technology With Biasing and Electron Cyclotron Resonance Plasma Deposition for Submicron Interconnections", published in J. Vac. Sci. Technology B, vol. 4, No. 4, Jul/Aug 1986, at pp 818-821; cross-reference to which four references is hereby made.

Each of the chambers 102-108 in vacuum apparatus 100 may also be used to carry out chemical vapor depositions (CVD), plasma etching, and other deposition and etching processes on a wafer or substrate 10 normally carried out under vacuum. Chambers 102-108 are each connected, via interlocks or slit valves 110, to a central chamber 116. Central chamber 116 contains a robot mechanism 120, comprising a wafer transfer blade 122 which is mounted for reversible linear movement indicated by the arrow at 124 and rotational movement as indicated at arrow 126. Specifically a four-bar link mechanism 130 imparts linear movement while rotational movement is provided by rotatable platform 134 on which is mounted four-bar link mechanism 130 and wafer support blade 122. A vertically indexable internal wafer support elevator 150 is used to store wafers within the vacuum apparatus for transfer to the various processing chambers 102-108 without breaking vacuum in the system. Another slit valve or interlock opening 110 is provided adjacent the elevator 150 for external loading of the wafers into vacuum apparatus 100 from external storage means 160.

Further details of the construction of such chambers, interlocks, and robotic mechanisms may be found in Toshima U.S. Pat. No. 4,785,962, assigned to the assignee of this invention and cross-reference to which is hereby made.

Thus, wafer or substrate 10 may be processed by ECR deposition, CVD deposition, and anisotropic dry etching without leaving the vacuum apparatus for purposes both of preventing contamination as well as enhancing process efficiency.

The invention, therefore, provides an improved planarization process wherein a first conformal insulation layer is deposited over a patterned substrate using an ECR plasma deposition process resulting in the formation of a dense coating with a high aspect ratio of deposition resulting in complete filling of low regions on the substrate between adjacent raised portions without the formation of voids in the deposited insulation layer. The application of a low melting glass planarization layer over the conformal insulation layer, which then may be dry etched, permits planarization of the structure without the need for removal of the semiconductor wafer from a vacuum apparatus. A further layer of insulation may then be optionally applied over the planarized structure using conventional CVD deposition to provide a faster deposition rate for such a subsequent insulation layer.

Having thus described the invention, what is claimed is:

1. A process for planarization of an integrated circuit structure in a vacuum apparatus, said structure having portions on the surface thereof higher than adjacent portion of the surface which comprises;
   (a) depositing a conformal insulation layer over said substrate using an ECR plasma deposition;
   (b) depositing a low melting inorganic planarization layer over said conformal insulation layer at a deposition temperature within a range of from about 100° C. to about 700° C. and sufficiently high within said range to permit said low melting inorganic planarizing layer to flow as it is deposited; and
   (c) etching said planarization layer to planarize said integrated circuit structure.

2. The process of claim 1 which comprises the further step of depositing a further insulation layer over said structure after said planarization step.

3. The process of claim 2 wherein said further deposition step comprises a CVD deposition step.

4. The process of claim 1 wherein said step of ECR plasma depositing said insulating layer further comprises depositing a layer of insulation material over said integrated circuit structure selected from the class consisting of silicon oxide, silicon oxynitride, silicon nitride, and phosphorus silicate.

5. The process of claim 4 wherein said step of ECR plasma depositing said insulating layer further comprises depositing a layer of silicon oxide over said integrated circuit structure.

6. The process of claim 1 wherein said ECR plasma deposition is carried out while maintaining the temperature of said deposition at from about 25° C. to about 400° C. and a pressure ranging from about 0.05 to about 20 millitorr.

7. The process of claim 1 wherein said ECR plasma deposition is carried out while maintaining a magnetic flux density used to provide the electron cyclotron resonance of said ECR plasma at a range of from about 500 to about 2500 gauss.

8. The process of claim 1 wherein said ECR plasma deposition is carried out using a microwave frequency to form the plasma ranging from about 1 to about 4 gHz and a plasma power level of from about 100 to about 1500 watts.

9. The process of claim 1 wherein said step of depositing said inorganic planarizing layer further comprises depositing an inorganic planarizing layer capable of being etched at about the same rate as said insulating layer.

10. The process of claim 9 wherein said step of depositing said low melting inorganic planarizing layer further comprises depositing within a temperature range of from about 300° C. to about 500° C. an inorganic planarizing layer of a material having a flow temperature of not greater than 500° C. and which will flow at the deposition temperature.

11. The process of claim 10 wherein said step of depositing said low melting inorganic planarizing layer further comprises depositing an inorganic planarizing layer consisting essentially of one or more low melting glasses selected from the class consisting of $B_2O_3$, $B_2S_6$, $B_2O_3/SiO_2$ mixtures, $As_2O_3$, $As_2S_3$, $P_2O_5$ and combinations thereof.

12. The process of claim 11 wherein said step of depositing said planarizing layer of low melting glass further comprises depositing a layer of $B_2O_3$ glass on said layer of insulation material.

13. A process for planarization of an integrated circuit structure in a vacuum apparatus, said structure having portions on the surface thereof higher than adjacent portion of the surface which comprises:
   (a) depositing a conformal insulation layer over said substrate, while maintaining said integrated circuit structure under vacuum, using an ECR plasma deposition which comprises;
      (i) maintaining a magnetic flux density at a range of from about 500 to about 2500 gauss to provide the electron cyclotron resonance used in said ECR plasma deposition; and
      (ii) using a microwave frequency to form said plasma ranging from about 1 to about 4 gHz and a plasma power level of from about 100 to about 1500 watts;
   (b) depositing over said conformal insulation layer, at a temperature within a range of from about 300° C. to about 500° C. and while maintaining said integrated circuit structure under vacuum, a planarization layer of a low melting inorganic glass material capable of being etched at about the same rate as said insulating layer and having a flow temperature of not greater than 500° C., said deposition being carried out at a temperature within said range which will permit said low melting inorganic glass material to flow as it is deposited;
   (c) anisotropically dry etching said low melting glass planarization layer, while maintaining said integrated circuit structure under vacuum, to planarize said integrated circuit structure; and
   (d) CVD depositing a further insulation layer over said structure after said planarization step, while maintaining said integrated circuit structure under vacuum;
whereby carrying out said steps of depositing said low melting glass planarization layer, anisotropically dry etching said low melting glass, and subsequently depositing a further insulation layer thereover, while maintaining said integrated circuit structure under vacuum, avoids exposing said low melting glass planarizing layer to moisture.

14. The process of claim 13 wherein said step of ECR plasma depositing said insulating layer further comprises depositing a layer of insulation material over said integrated circuit structure selected from the class consisting of silicon oxide, silicon oxynitride, silicon nitride, and phosphorus silicate.

15. The process of claim 13 wherein said step of depositing said low melting inorganic planarizing layer further comprises depositing an inorganic planarizing layer consisting essentially of one or more low melting glasses selected from the class consisting of $B_2O_3$, $B_2S_6$, $B_2O_3/SiO_2$ mixtures, $As_2O_3$, $As_2S_3$, $P_2O_5$ and combinations thereof.

16. The process of claim 13 including the step of locating one or more deposition zones and an etching zone in the same or separate portions of a common vacuum apparatus wherein said integrated circuit structure may be processed in one or more of said zones while maintaining said integrated circuit structure under vacuum in said apparatus.

17. A process for planarization of an integrated circuit structure in a vacuum apparatus, said structure having portions on the surface thereof higher than adjacent portion of the surface which comprises:
   (a) depositing a conformal insulation layer over said substrate selected from the class consisting of silicon oxide, silicon oxynitride, silicon nitride, and phosphorus silicate, while maintaining said integrated circuit structure under vacuum, using an ECR plasma deposition which comprises;
      (i) maintaining a magnetic flux density at a range of from about 500 to about 2500 gauss to provide the electron cyclotron resonance used in said ECR plasma deposition; and
      (ii) using a microwave frequency to form said plasma ranging from about 1 to about 4 gHz and a plasma power level of from about 500 to about 1500 watts;
   (b) depositing over said conformal insulation layer, at a temperature within a range of from about 300° C. to about 500° C. and while maintaining said integrated circuit structure under vacuum, a planarization layer of a low melting inorganic glass material capable of being etched at about the same rate as said insulating layer and having a flow temperature of not greater than 500° C. and consisting essentially of one or more low melting glasses selected from the class consisting of $B_2O_3$, $B_2S_6$, $B_2O_3/SiO_2$ mixtures, $As_2O_3$, $As_2S_3$, $P_2O_5$ and combinations thereof, said deposition being carried out at a temperature within said range which will permit said low melting inorganic glass material to flow as it is deposited;
   (c) anisotropically dry etching said low melting glass planarization layer, while maintaining said integrated circuit structure under vacuum, to planarize said integrated circuit structure; and
   (d) CVD depositing a further insulation layer over said structure after said planarization step, while maintaining said integrated circuit structure under vacuum.

18. A process for planarization of an integrated circuit structure in a vacuum apparatus, said structure having portions on the surface thereof higher than adjacent portion of the surface which comprises;
   (a) depositing a conformal insulation layer over said substrate using an ECR plasma deposition;
   (b) depositing a low melting inorganic planarization layer over said conformal insulation layer at a deposition temperature within a range of from about 100° C. to about 700° C. and sufficiently high within said range to permit said low melting inorganic planarizing layer to flow as it is deposited; and
   (c) anisotropically dry etching said planarization layer to planarize said integrated circuit structure without removing said structure from said vacuum apparatus.

19. The process of claim 18 wherein said step of anisotropically etching said planarization layer further comprises removing a portion of said low melting inorganic planarization layer; and said process further comprises the additional step of depositing a further insulation layer over said structure to encapsulate any remaining portions of said planarizing layer.

20. The process of claim 18 wherein said step of depositing said low melting inorganic planarizing layer is carried out within a temperature range of from about 300° C. to about 500° C.

21. The process of claim 20 wherein said step of depositing said low melting inorganic planarizing layer is carried out within a temperature range of from about 390° C. to about 480° C.

* * * * *